US008996337B1

(12) United States Patent
Müller-Fischer

(10) Patent No.: US 8,996,337 B1
(45) Date of Patent: Mar. 31, 2015

(54) HIERARCHICAL POSITION-BASED DYNAMICS

(75) Inventor: Matthias Müller-Fischer, Stäfa (CH)

(73) Assignee: NVIDIA Corporation, Santa Clara, CA (US)

( * ) Notice: Subject to any disclaimer, the term of this patent is extended or adjusted under 35 U.S.C. 154(b) by 1353 days.

(21) Appl. No.: 12/501,323

(22) Filed: Jul. 10, 2009

(51) Int. Cl.
*G06F 7/60* (2006.01)
*G06G 7/48* (2006.01)
*G06T 15/06* (2011.01)

(52) U.S. Cl.
USPC .................................................. 703/2; 703/6

(58) Field of Classification Search
USPC .......................................................... 703/2, 6
See application file for complete search history.

(56) References Cited

U.S. PATENT DOCUMENTS

| 6,332,002 | B1 * | 12/2001 | Lim et al. ................. | 375/240.17 |
| 2007/0206008 | A1 * | 9/2007 | Kaufman et al. ............ | 345/424 |
| 2009/0167763 | A1 * | 7/2009 | Waechter et al. ............ | 345/426 |

OTHER PUBLICATIONS

Selle et al.; Robust High-Resolution Cloth Using Parallelism, History-Based Collisions, and Accurate Friction; Mar./Apr. 2009; IEEE Transactions on Visualization and Computer Graphics, vol. 15, No. 2; pp. 339-350.*
Thomaszewski et al.; Continuum-based Strain Limiting; Apr. 2009, Computer Graphics Forum, vol. 28, Issue 2, pp. 569-576.*
Georgii and Westermann, "Interactive Simulation and Rendering of Heterogeneous Deformable Bodies", 2005, "Proceedings of Vision, Modeling and Visualization", pp. 383-391.*
Otaduy et al., "Adaptive Deformations with Fast Tight Bounds", 2007, ACM SIGGRAPH/Eurographics Symposium on Computer Animation Proceedings, pp. 181-190.*
Irving et al., Volume Conserving Finite Element Simulations of Deformable Models, 2007, ACM Transactions on Graphics, vol. 26, No. 3, Article 13, pp. 13-1 to 13-6.*
Bridson et al., "Robust Treatment of Collisions, Contact and Friction for Cloth Animation", 2002, 29th annual conference on Computer graphics and interactive techniques Proceedings, pp. 594-603.*
Georgii and Westermann, Corotated finite elements made fast and stable, 2008, Proceedings of the 5th Workshop on Virtual Reality Interaction and Physical Simulation, pp. 1-9.*
Frank et al., Learning Cost Functions for Mobile Robot Navigation in Environments with Deformable Objects, 2008, Workshop on Path Planning on Cost Maps at the IEEE International Conference on Robotics and Automation, pp. 1-9.*

(Continued)

*Primary Examiner* — Kamini S Shah
*Assistant Examiner* — Juan Ochoa
(74) *Attorney, Agent, or Firm* — Artegis Law Group, LLP

(57) ABSTRACT

A physics simulation engine simulates the motion of one or more particles that represent virtual objects in a virtual graphics scene. Each particle is assigned to a level in a particle hierarchy that has at least two levels. The physics simulation engine collapses constraints associated with particles assigned to a first level of the particle hierarchy to generate hierarchical constraints associated with particles assigned to the second level of the particle hierarchy. The physics simulation engine updates the position of each particle assigned to the second level of the particle hierarchy by enforcing constraints associated with the particle. The physics simulation engine then updates the position of each particle assigned to the first level of the particle hierarchy based on the positions of the particles assigned to the second level of the particle hierarchy.

22 Claims, 12 Drawing Sheets

(56) References Cited

OTHER PUBLICATIONS

Bridson, et al. "Robust treatment of collisions, contact and friction for cloth animation," Proceedings of ACM Siggraph (2002), pp. 594-603.

Barbic, et al. "Time-critical distributed contact for 6-dof haptic rendering of adaptively sampled reduced deformable models," In SCA '07: Proceedings of the 2007 ACM SIGGRAPH/Eurographics symposium on Computer animation (Aire-la-Ville, Switzerland, 2007), Eurographics Association, pp. 171-180.

Chentanez, et al. "Liquid Simulation on Lattice-Based Tetrahedral Meshes," In SCA '07: Proceedings of the 2007 ACM SIGGRAPH/Eurographics symposium on Computer animation (Aire-la-Ville, Switzerland, 2007), Eurographics Association, pp. 219-228.

Capell, et al. "A multiresolution Framework for Dynamic Deformations," In proceedings of SCA 2002 (2002), pp. 1-8.

Debunne, et al. "Dynamic Real-Time Deformations using Space and Time Adaptive Sampling," In Computer Graphics Proceedings (Aug. 2001), Annual Conference Series, ACM Press / ACM SIGGRAPH. Proceeding.

Desbrun, et al. "Interactive Animation of Structured Deformable Objects," In Proceedings of Graphics Interface '99 (1999), pp. 1-8.

Faure, F. "Interactive Solid Animation Using Linearized Displacement Constraints," In Eurographics Workshop on Computer Animation and Simulation (EGCAS) (1998), pp. 61-72.

Goldenthal, et al. "Efficient Simulation of Inextensible Cloth," ACM Trans. Graph. 26, 3 (2007), pp. 7.

Gibson, et al. "A Survey of Deformable Modeling in Computer Graphics," Technical Report TR-97-I9, MERL (1997).

Georgii, et al. "A Multigrid Framework for Real-Time Simulation of Deformable Volumes," Computers & Graphics 30, 3 (2006), pp. 408-415.

Hauser, et al. "Interactive Deformation Using Modal Analysis with Constraints," In Graphics Interface '03 (2003).

Jakobsen, T. "Advanced Character Physics," www.gamasutra.com (2003). p. 1-15.

James, et al. "Accurate Real Time Deformable Objects," In Computer Graphics Proceedings (Aug. 1999), Annual Conference Series, ACM SIGGRAPH 1999, pp. 65-72.

Muller, et al. "Interactive Virtual Materials," In GI '04: Proceedings of Graphics Interface 2004 (School of Computer Science, University of Waterloo, Waterloo, Ontario, Canada, 2004), Canadian Human Computer Communications Society, pp. 239-246.

Muller, et al. "Position Based Dynamics," Proceedings of Virtual Reality Interactions and Physical Simulations (2006), pp. 71-80.

Muller, et al. "Meshless Deformations Based on Shape Matching," Proceedings of ACM Siggraph (2005), pp. 471-478.

Nealen, et al. "Physically Based Deformable Models in Computer Graphics," Eurographics 2005 state of the art report (2005).

Otaduy, et al. "Adaptive Deformations with Fast Tight Bounds," In SCA '07: Proceedings of the 2007 ACM SIGGRAPH/Eurographics symposium on Computer animation (Aire-la-Ville, Switzerland, 2007), Eurographics Association, pp. 181-190.

Provot, X. "Deformation Constraints in a Mass-Spring Model to Describe Rigid Cloth Behavior," Proceedings of Graphics Interface (1995), pp. 147-154.

Terzopoulos, et al. "Elastically Deformable Models," In Computer Graphics Proceedings (Jul. 1987), Annual Conference Series, ACM SIGGRAPH 1987, pp. 205-214.

Volino, et al. "Versatile and Efficient Techniques for Simulating Cloth and Other Deformable Objects," Proceedings of ACM Siggraph (1995), pp. 137-144.

Wu, et al. "Multigrid Integration for Interactive Deformable Body Simulation," In ISMS (2004), pp. 92-104.

\* cited by examiner

HIERARCHICAL POSITION-BASED DYNAMICS

BACKGROUND OF THE INVENTION

1. Field of the Invention

Embodiments of the invention relate generally to physics simulations and more specifically to hierarchical position-based dynamics.

2. Description of the Related Art

Conventional computer graphics (CG) engines are capable of generating highly realistic images representing real-world or imaginary scenes. These images are typically composed of a plurality of different particles. A collection of such particles can be used to represent different objects in the virtual graphics scene, including rocks, trees, cloth, water, and people, among others. Some CG engines perform physical simulations of the motion of the particles in the virtual graphics scene, thus simulating the motion of the objects represented by those particles. The physical simulations typically apply equations of motion to each particle to predict the position of the particle at a particular time step in the physical simulation. A wide variety of techniques are available for applying equations of motion to particles in the virtual graphics scene. One commonly-used technique is known as the "explicit Euler" technique.

In conventional systems, the explicit Euler technique can be used to predict the position of each particle in the virtual graphics scene by integrating a set of forces acting on the particle to generate one or more velocity components for the particle. The velocity components are then integrated to generate a position prediction for the particle. One problem with the explicit Euler technique is that each integral is approximated; thus, the position of the particle may not always be predicted with a high degree of accuracy, especially for larger time steps. Approximation errors can accumulate over multiple time steps, potentially causing the simulation to diverge, which may result in a numerical explosion.

One solution to the problems with the explicit Euler technique is to correct the generated position predictions based on a set of constraint equations associated with each particle. A constraint equation restricts the position of a particle and typically takes the form of an equality or of an inequality. For example, an equality constraint equation $C_1$ that restricts the height $H_P$ of a particle $P_j$ to zero in a virtual graphics scene would be $C_1(P_j)=H_{Pj}=0$. In another example, an inequality constraint equation $C_2$ that restricts the distance between particles $P_j$ and $P_k$ to be less than a distance D would be $C_2(P_j, P_k)=|P_j-P_k|-D<0$. The constraint equations for each particle can be solved to generate a position correction that, when applied to the position predictions generated by the explicit Euler technique, results in a corrected position prediction. Many techniques for solving constraint equations are known in the art.

For example, some physical simulations employ a Gauss-Seidel solver to solve the constraint equations for each particle. However, Gauss-Seidel solvers suffer from certain drawbacks. The main drawback is that each constraint is solved separately from all other constraints. This causes error corrections to propagate slowly through the particles and the solver to converge slowly to the correct solution. If the number of solver iterations is limited by a time budget, as is the case in computer games, the result computed by a Gauss-Seidel may diverge significantly from the true solution. In the case of a cloth simulation, this causes visual stretchiness.

There are methods that solve for all constraints simultaneously. Examples are the Conjugate Gradients method and the multi-grid method. For these methods to work, the constraints have to be linearized, which may be time consuming. In addition, the linearization can introduce stability problems because it replaces the true constraint functions by approximations which are only valid in a certain region.

As the foregoing illustrates, there remains a need in the art for a more effective way to simulate the motion of particles in a virtual graphics scene.

SUMMARY OF THE INVENTION

One embodiment of the invention sets forth a computer-implemented method for executing a physics simulation of a plurality of particles in a virtual graphics scene. The method includes the steps of generating a position prediction for a first particle assigned to a first level of a particle hierarchy that includes the first level and a second level, where each particle in the plurality of particles is assigned to either the first level or the second level of the particle hierarchy, and generating a position prediction for a second particle assigned to the second level of the particle hierarchy. The method further includes the steps of generating a corrected position prediction for the first particle based on the position prediction for the first particle and one or more constraint equations associated with the first particle, generating a corrected position prediction for the second particle based on the corrected position prediction for the first particle, and generating an image for storage in a memory and/or display on a display device based on the corrected position prediction for the first particle and the corrected position prediction for the second particle.

Advantageously, constraint equations are solved for fewer particles at each timestep in the physics simulation since the second level of the particle hierarchy only includes a subset of the particles in the virtual graphics scene. The corrected position predictions generated for these particles can then be used to generate corrected position predictions for the particles in the first level of the particle hierarchy. By implementing the physics simulation engine, more detailed physics simulations are possible, when compared to prior art techniques.

Since fewer constraint equations need to be solved at each timestep, a corrected position prediction can be generated for each particle in the virtual graphics scene and can thus be generated for all of the particles that represent a particular virtual object. The physics simulation engine is thereby capable of generating a physically accurate simulation of the virtual object, allowing physically realistic images to be generated based on that physics simulation.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
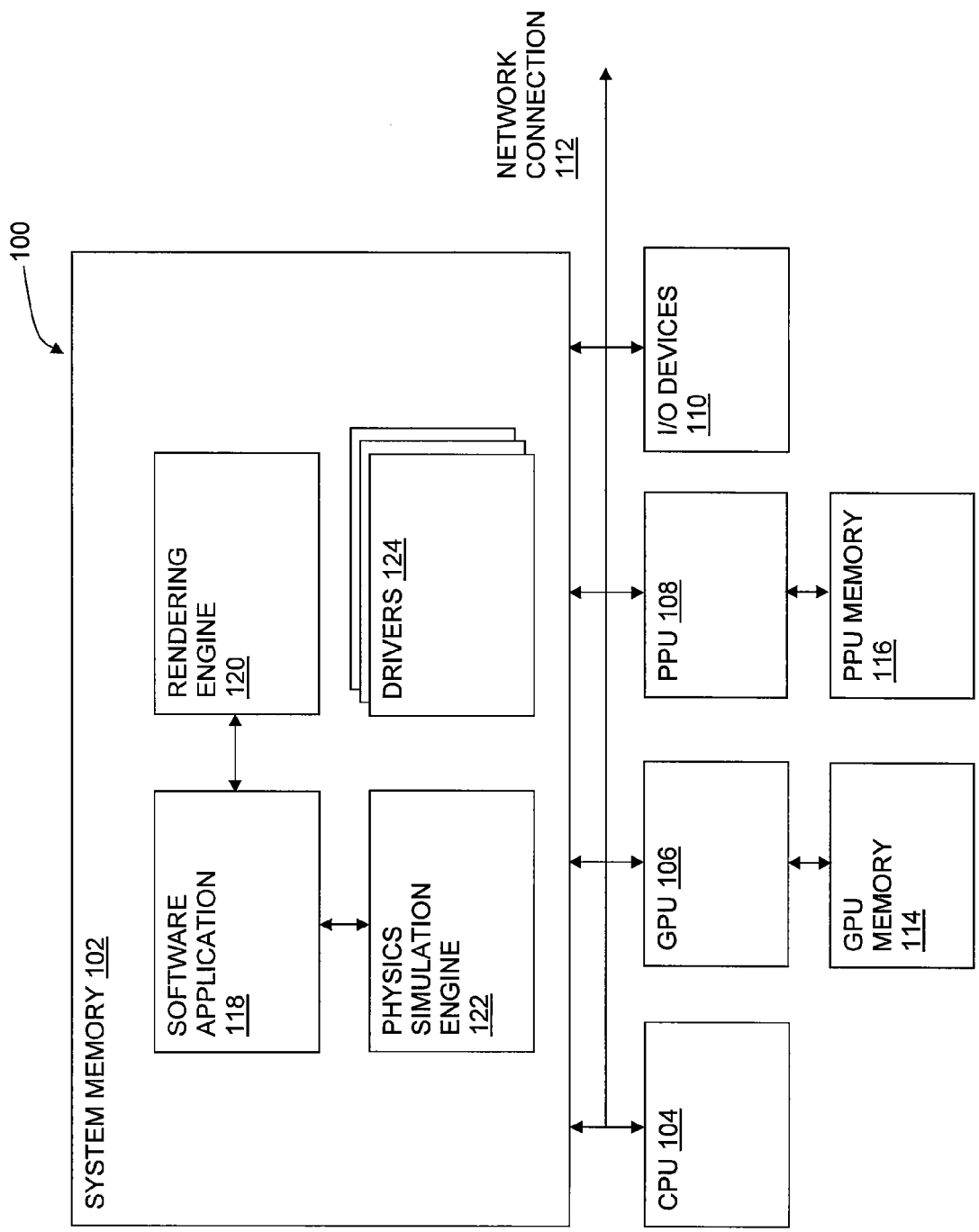
FIG. 1 is computer system configured to implement one or more aspects of the invention.

In the following description, numerous specific details are set forth to provide a more thorough understanding of the invention. However, it will be apparent to one of skill in the art that the invention may be practiced without one or more of these specific details. In other instances, well-known features have not been described in order to avoid obscuring the invention.

Embodiments of the present invention set forth techniques to create a hierarchy of particle sets before a physics simulation of those particles is initiated. In some embodiments, a particle set 0 contains the entire plurality of the particles. A particle set 1 contains a subset of the particles in the particle set 0. In general, particle set i contains a subset of the particles in particle set i−1. A hierarchy of constraints is also created. A constraint set 0 contains all the constraints. A constraint set 1 contains only constraints for particles in particle set 1. In general, constraint set i only contains constraints for particles in particle set i. Connections between particles in subsequent sets are also created. The particles in particle set 0 have connections to at least two particles in particle set 1. In general, each particle in particle set i has links to at least two particles in particle set i+1. The particles in the last particle set have no links. The hierarchy of particles and constraints can be used to improve the convergence of the solver during the simulation.

At each time step, the solver processes all particle sets and constraint sets starting from the highest. In the highest constraint set, the constraint equations belonging to that set are solved using the Gauss-Seidel technique and the positions of the particles in the highest particle set are corrected. The particle connections are then used to propagate the corrections to a lower particle set. A particle in the particle set below the highest particle set has at least two links to particles in the highest particle set (called parents). To determine the correction of this particle, the corrections of its parent particles are averaged. In a second step, the constraint equations in the second to highest constraint set are solved using the Gauss-Seidel technique. The resulting corrections are propagated to the level below. This process is repeated until particle set 0 is reached.

This method highly improves the convergence rate of the Gauss-Seidel constraint solver. This is because error corrections can propagate much faster through a system of a large number of particles and constraints. The reason is that constraints in higher levels directly connect particles that are connected by a long series of constraints in the original particle system. The improved convergence rate results in more accurate particle positions especially when the number of solver iteration is limited due to time restrictions as present in computer games. The visual result is that cloth and soft bodies look less stretchy. The specific techniques that implement this functionality are described in detail below.

FIG. 1 is a block diagram that illustrates a computer system 100 configured to implement one or more aspects of the invention. As shown, the computer system 100 includes a system memory 102, a central processing unit (CPU) 104, a graphics processing unit (GPU) 106, a physics processing unit (PPU) 108, one or more input/output (I/O) devices 110, a network connection 112, a GPU memory 114, and a PPU memory 116. The CPU 104, the GPU 106, the PPU 108 and the I/O devices 110 are each associated with one or more drivers 124 stored in the system memory 102. The drivers 124 are software programs that may be executed by the various processing units of the computer system 100, including the CPU 104, the GPU 106, the PPU 108, and/or the I/O devices 110 to translate program instructions into machine code. For example, the PPU 108 may execute the driver 124 associated with the PPU 108 to translate program instructions into machine code native to the PPU 108.

The CPU 104 is the primary processor in the computer system 100 and is configured to execute a software application 118, a rendering engine 120, a physics simulation engine 122, and one or more of the drivers 124 stored in the system memory 102. The software application 120, the rendering engine 122, and the physics simulation engine 122 cooperate to generate physically accurate computer graphics, as described in greater detail below in FIGS. 2-8. When executing these software programs, the CPU 104 may read data from or write data to the system memory 102. In one embodiment, the CPU 104 is coupled to the GPU 106 and to the PPU 108.

The GPU 106 and the PPU 108 are co-processors that supplement the processing capabilities of the CPU 104. The GPU 106 increases the graphics processing capabilities of the computer system 100. In one embodiment, the computer system 100 includes multiple GPUs that operate in concert or independently to perform graphics processing operations. The GPU 106 is coupled to the GPU memory 114 and to the system memory 102. The GPU 106 executes software programs stored in the GPU memory 114 or the system memory 102. The GPU 106 reads data from and/or writes data to the GPU memory 114 and/or to the system memory 102 when executing software programs. The software programs executed by the GPU 106 configure various hardware components (not shown) within the GPU 106 to perform different graphics processing tasks. The GPU 106 is accessible by software programs executing on the CPU 104 and/or the PPU 108. For example, the rendering engine 120 may access the GPU 106 to perform graphics processing operations.

The PPU 108 is a specialized processing unit that performs physics calculations to increase the physics processing capabilities of the computer system 100. The PPU 108 may be, for example, a PhysX™ chip. The PPU 108 may be integrated on the same chip as the CPU 104 and/or the GPU 106 or, alternatively, may be located on an add-in card coupled to the computer system 100. In one embodiment, the computer system 100 includes multiple PPUs that operate in concert or independently to perform physics processing operations. The PPU 108 is coupled to the PPU memory 116 and to the system memory 102. The PPU 108 executes software programs stored in the PPU memory 116 and/or the system memory 102. The PPU 108 reads data from and/or writes data to the PPU memory 116 and/or the system memory 102 when executing software programs. The software programs executed by the PPU 108 may configure various hardware components (not shown) within the PPU 108 to perform different physics processing tasks. The PPU 108 is accessible by software programs executing on the CPU 104 and/or the GPU 106. For example, the physics simulation engine 122 may access the PPU 108 to perform physics processing operations.

In one embodiment, the GPU 106 and the PPU 108 are integrated onto a single chip that provides both graphics processing and physics processing functionality. In another embodiment, the CPU 104, the GPU 106 and the PPU 108 are all integrated onto a single chip that performs general processing operations, graphics processing operations, and physics processing operations for the computer system 100. Various other architectural configurations are also within the scope of embodiments of the present invention.

The CPU 104, the GPU 106, and the PPU 108 are each coupled to the I/O devices 110. The I/O devices 110 include input devices, such as a keyboard, a mouse, a video game controller, a microphone, a touchpad, a scanner, a stylus, a CD-ROM drive, and a DVD drive, among others. The I/O devices 110 also include output devices, such as a cathode-ray tube (CRT) monitor, a liquid crystal display (LCD) monitor, a printer, and a speaker, among others. The CPU 104, the GPU 106 and the PPU 108 receive data from the I/O devices 110 and transmit data to the I/O devices 110. Data received from the I/O devices 110 may be stored in the system memory 102, the GPU memory 114, and/or the PPU memory 116.

The CPU 104, the GPU 106, and the PPU 108 may access a network via the network connection 112. The network connection 112 may be an Ethernet connection, a cable connection, a wireless connection, or a telephone connection and may provide a connection to any type of network, including the World Wide Web, the Internet, a local area network (LAN), a wide area network (WAN), an intranet, a cellular network, or any other technically feasible type of network. When the network connection 112 is implemented as an Ethernet connection, the computer system 100 includes an Ethernet controller. The CPU 104, the GPU 106, and the PPU 108 may download data from or upload data to remote computing systems and/or external memory units via the network connection 112. The data downloaded via the network connection 112 may be stored in the system memory 102, the GPU memory 114, and/or the PPU memory 116.

As described, the system memory 102 includes the software application 118, the rendering engine 120, and the physics simulation engine 122. The software application 118 may be any technically feasible software application that generates a virtual graphics scene, including a video game, a computer-aided design (CAD) application, or an animation application, among others. The virtual graphics scene may include one or more virtual objects. For example, the software application 118 could be a video game that generates a virtual graphics scene representing a particular level in the video game. The virtual graphics scene could include a virtual object, such as a character controlled by a user via the I/O devices 110. The software application 118 generates an image based on the virtual graphics scene using the rendering engine 120 and the physics simulation engine 122 and then outputs the image to the I/O devices 110, such as a display device.

The software application 118 accesses the rendering engine 120 to generate pixels that make up the image. The pixels may then be output to a display device. The rendering engine 120 may implement a variety of rendering approaches, including ray tracing, ray casting, radiosity, and/or rasterization. The rendering engine 120 may be implemented as a software rendering engine or as a hardware rendering engine. The rendering engine 120 may also be implemented as a combination of software and hardware. The rendering engine 120 may offload graphics processing tasks onto the GPU 106 to increase processing efficiency.

The software application 118 also accesses the physics simulation engine 122 to implement a physics simulation of the virtual objects in the virtual graphics scene. For a particular virtual object in the virtual graphics scene, the physics simulation engine 122 may simulate the motion of each particle associated with that virtual object. For example, the virtual graphics scene could include a curtain hanging in a doorway, and the physics simulation engine 122 could simulate the motion of the curtain by simulating the motion of each particle associated with the curtain. Then, when the software application 118 generates the image, the curtain may appear physically accurate and physically realistic.

At a current time step in the physics simulation, each particle occupies a current position in the virtual graphics scene. For example, if the virtual graphics scene is a three-dimensional (3D) space represented in Cartesian coordinates, then the current position of a particle could be represented by X, Y, and Z coordinates. At the current time step, the physics simulation engine 122 simulates the motion of the particle in the virtual graphics scene to predict the position of the particle at a subsequent time step in the physics simulation.

The physics simulation engine 122 simulates the motion of the particle by integrating one or more external forces associated with the particle at each time step to generate a velocity prediction for the particle. The external forces could be, for example, a gravitational force, a magnetic force, or a drag force. Each external force includes force components that act in one or more different directions. If the virtual graphics scene is represented in Cartesian coordinates, as described above, then the force components Fx, Fy, and Fz would act in X, Y, and Z directions, respectively. The physics simulation engine 122 integrates each force component associated with the particle to generate a corresponding velocity component for the particle. Returning to the above example, the physics simulation engine 122 could integrate the Fx, Fy, and Fz force components to generate Vx, Vy, and Vz velocity components. The velocity components represent the velocity prediction for the particle.

The physics simulation engine 122 then integrates the velocity components to generate a position prediction for the particle at a subsequent time step. Returning again to the above example, the physics simulation engine 122 could integrate the Vx, Vy, and Vz velocity components to generate X, Y, and Z coordinates representing the position prediction for the particle at the subsequent time step. Those skilled in the art will recognize that force components, velocity components, and position coordinates can be represented in a wide variety of different coordinate systems including, for example, cylindrical or spherical coordinate systems, among others, all of which fall within the scope of the present invention. In one embodiment, the physics simulation engine 122 implements the explicit Euler numerical integration algorithm when integrating the force components and the velocity components. Those skilled in the art will recognize that a wide variety of numerical integration techniques may be used to integrate the force and velocity components of each particle, all of which fall within the scope of the present invention.

Depending on the technique used to integrate the force and velocity components of the particle, the physics simulation engine 122 may generate a position prediction for the particle with varying degrees of accuracy. The physics simulation engine 122 is configured to improve the accuracy of the position prediction by generating a corrected position prediction based on the position prediction. The physics simulation engine 122 may generate the corrected position prediction for the particle by enforcing one or more constraint equations, or "constraints," associated with the particle.

As described in greater detail below in FIGS. 2-3 and 5-7, a constraint may be an "initial" constraint that is initially associated with the particle, a "hierarchical" constraint that is generated based on an initial constraint, or a "collision" constraint that is generated by the physics simulation engine 122 dynamically during the physics simulation when two or more particles collide. The physics simulation engine 122 enforces a constraint, either an initial constraint, hierarchical constraint, or collision constraint, by modifying the position prediction for the particle until the constraint is satisfied, thus generating a corrected position prediction. For example, if a constraint $C_1$ restricts the height of the particle to be greater than 10, and the position prediction for the particle specifies that the height of the particle would be equal to 9 at a subsequent time step, then the physics simulation engine 122 could modify the position prediction for the particle until the height is greater than 10, thus generating a corrected position prediction for the particle that satisfies the constraint. In situations where a constraint is associated with two or more particles, the physics simulation engine 122 modifies the position predictions for the two or more particles to generate corrected position predictions for the two or more particles that satisfy the constraint associated with those particles.

Figure 2:
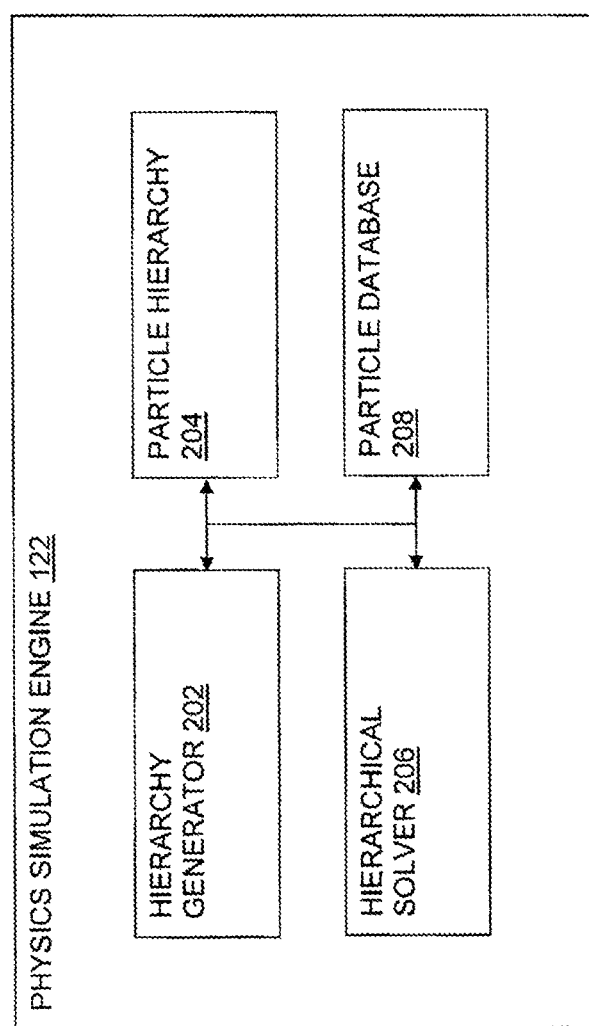
FIG. 2 is a conceptual diagram that illustrates a physics simulation engine of FIG. 1 in greater detail, according to one embodiment of the invention.
Figure 6:
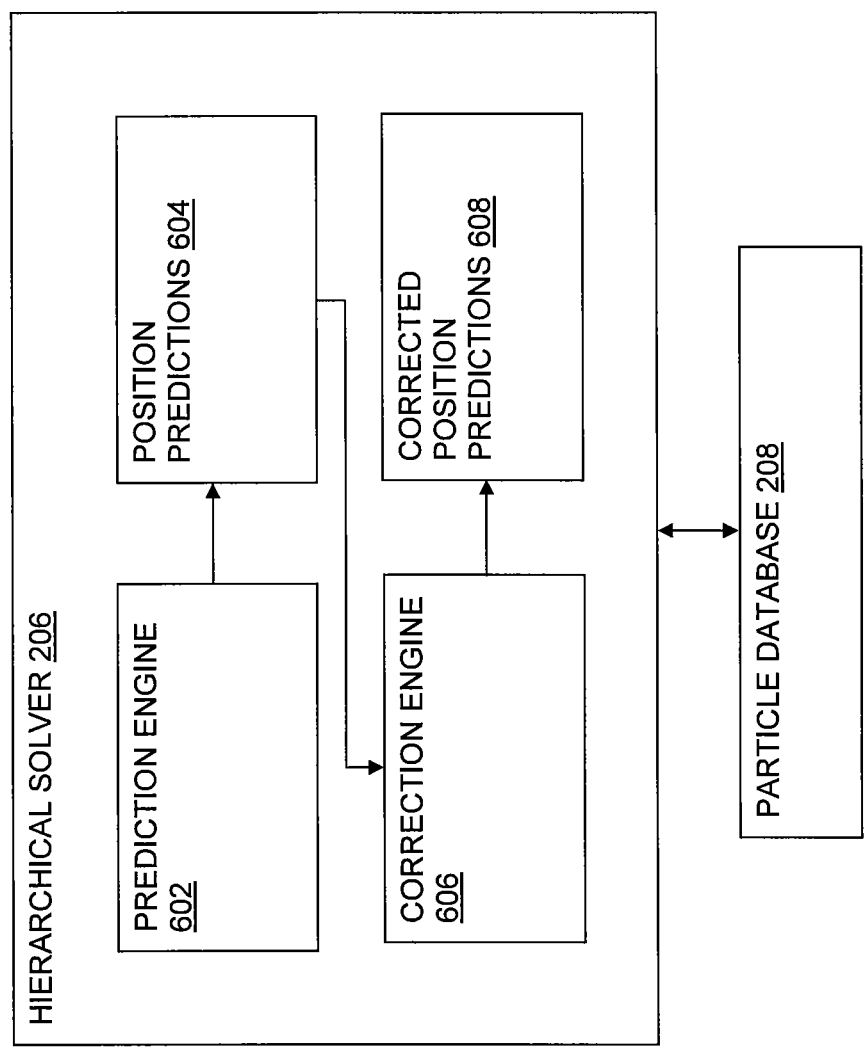
FIG. 6 is conceptual diagram that illustrates the hierarchical solver of FIG. 2 in greater detail, according to one embodiment of the invention.
Figure 7A:
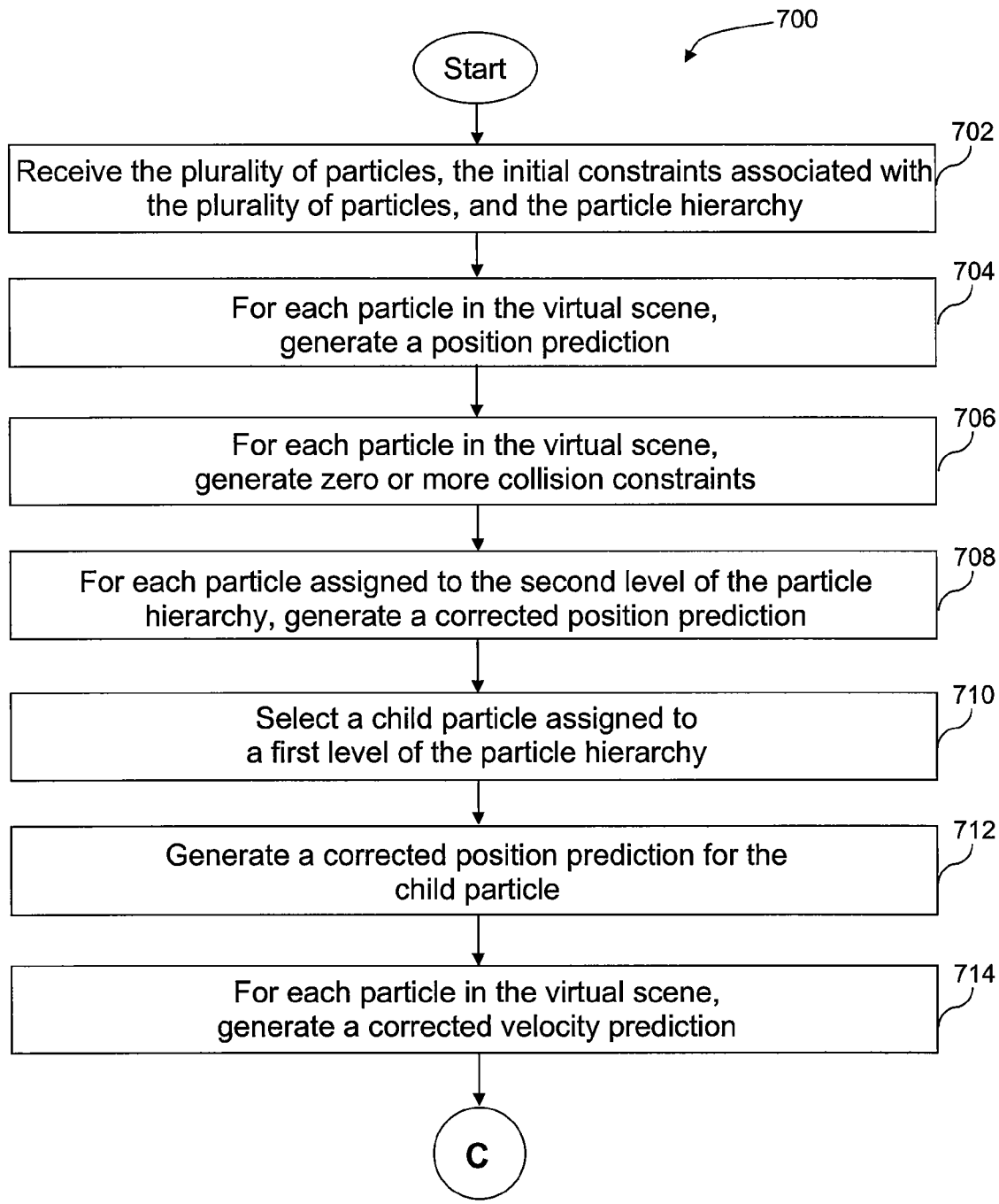
FIG. 7A sets forth a flowchart of method steps for generating a corrected position prediction for a first particle and a corrected position prediction for a second particle, according to one embodiment of the invention.
Figure 7A:
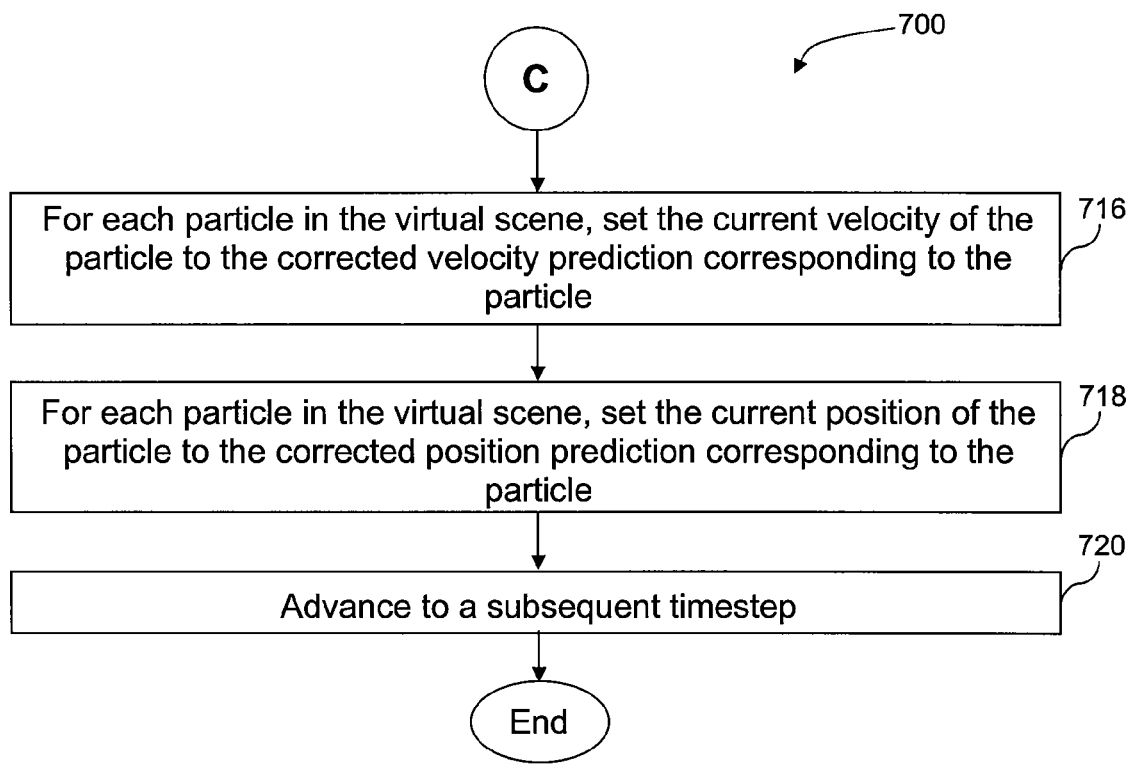

The physics simulation engine 122 may also generate a corrected position prediction for certain particles in the virtual graphics scene based on the corrected position predictions for one or more other particles in the virtual graphics scene, as described in greater detail in FIGS. 2 and 6-7.

Once the physics simulation engine 122 generates a corrected position prediction for each particle in the virtual graphics scene, the physics simulation engine 122 generates a corrected velocity prediction for the particle based on the current position of the particle, the corrected position prediction for the particle, and the size of the time step. The physics simulation engine then sets the current position of the particle to the corrected position prediction corresponding to that particle, sets the current velocity of the particle to the corrected velocity prediction for the particle, and advances to the subsequent time step in the physics simulation.

When the physics simulation engine 122 sets the current position of each particle to the corrected position prediction corresponding to the particle, the physics simulation engine 122 also transmits the current position of each particle to the software application 118. The software application 118 may then implement the rendering engine 120 to render an image representing the virtual graphics scene. The image may then be displayed on a display device included in the I/O devices 110.

FIG. 2 is a conceptual diagram that illustrates the physics simulation engine 122 in greater detail, according to one embodiment of the invention. As shown, the physics simulation engine 122 includes a hierarchy generator 202, a particle hierarchy 204, a hierarchical solver 206, and a particle database 208. The particle database 208 includes, for each particle in the virtual graphics scene, an initial position and an initial velocity for the particle (e.g., the position and velocity of the particle before the physics simulation engine 122 executes the physics simulation), the external forces acting on the particle, a current velocity and a current position of the particle (e.g., the velocity and position of the particle at a current time step), and a set of initial constraints associated with the particle.

The particle hierarchy 204 is a data structure that is used by the hierarchical solver 206 to enforce the constraints associated with each particle in the virtual graphics scene. The particle hierarchy 204 includes at least a first level and a second level. The hierarchy generator 202 is configured to generate the particle hierarchy 204 prior to the physics simulation engine 122 executing the physics simulation. When generating the particle hierarchy 204, the hierarchy generator 202 assigns each particle to the first level or to the second level of the particle hierarchy 204, as described in greater detail below in FIGS. 3-4. In one embodiment, particles having a "fine" level of detail are assigned to the first level of the particle hierarchy 204, while particles having a "coarse" level of detail are assigned to the second level of the particle hierarchy 204. In alternative embodiments, the particle hierarchy 204 includes any number of different levels to which particles are assigned having different levels of detail.

A first particle assigned to the first level of the particle hierarchy 204 is referred to herein as a "child" particle of a second particle assigned to the second level of the particle hierarchy 204 when the first particle and the second particle are both associated with at least one common constraint. The second particle is referred to herein as a "parent" particle of the first particle. Each child particle is associated with at least two parent particles, and each parent particle is associated with at least one child particle. When generating the particle hierarchy 204, the hierarchy generator 202 generates a "correction weight" between each child particle and each parent particle of the child particle. A correction weight is a value, such as an integer value or a decimal value, used by the hierarchical solver 206 to generate corrected position predictions for each child particle based on the corrected position predictions for the parent particles of the child particle, as described herein.

When the physics simulation engine 122 executes the physics simulation, at the current time step in the physics simulation, the hierarchical solver 206 generates a velocity prediction and a position prediction for each particle in the virtual graphics scene, including each parent particle and each child particle. The hierarchical solver 206 then generates a corrected position prediction for each parent particle by enforcing the initial constraints, hierarchical constraints, and collision constraints associated with the parent particle.

For each child particle, the hierarchical solver 206 identifies the parent particles of the child particle. The hierarchical solver 206 then generates a corrected position prediction for the child particle based on the difference between the position prediction and the corrected position prediction generated for each parent particle of the child particle and based on the correction weights between those parent particles and the child particle. In this fashion, the physics simulation engine 122 generates a corrected position prediction for each particle in the virtual graphics scene.

The hierarchical solver 206 then generates the corrected velocity prediction, as described in FIG. 1. The hierarchical solver 206 accesses the particle database 208 and updates the current velocity and current position of each particle to reflect the corrected position prediction and corrected velocity prediction for that particle, respectively. The physics simulation engine 122 may then proceed to a subsequent time step in the physics simulation.

Figure 3:
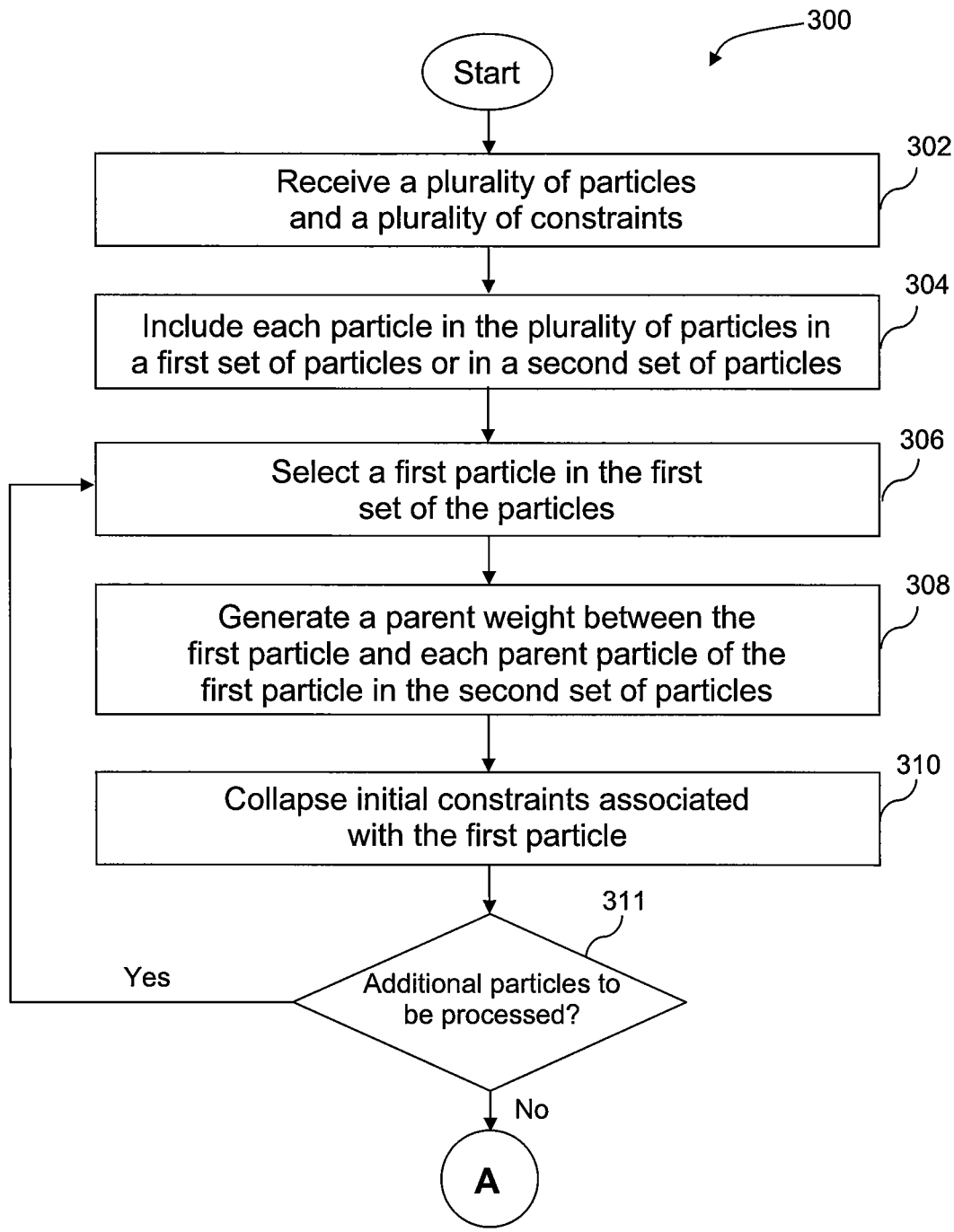
FIG. 3 sets forth a flowchart of method steps for generating a particle hierarchy, according to one embodiment of the invention.
Figure 3:
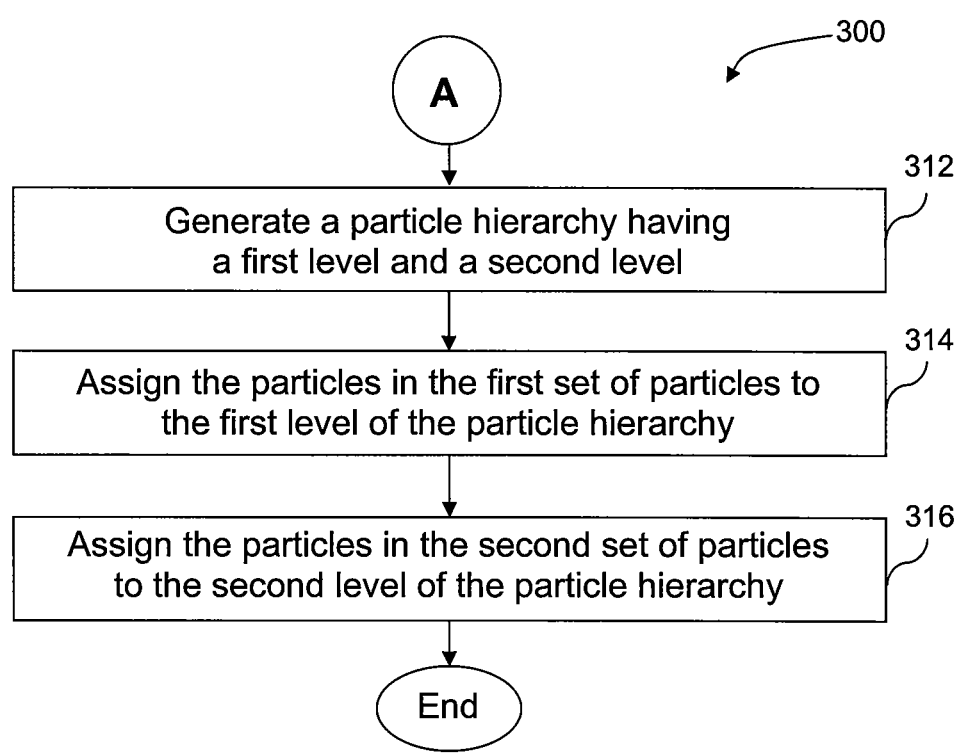

FIG. 3 sets forth a flowchart of method steps for generating the particle hierarchy 204, according to one embodiment of the invention. Persons skilled in the art will understand that, although the method 300 is described in conjunction with the systems of FIGS. 1-2, any system configured to perform the method steps, in any order, is within the scope of the present invention. In one embodiment, the method 300 described herein is implemented by the hierarchy generator 202 prior to the physics simulation engine 122 executing the physics the physics simulation.

As shown, the method 300 begins at step 302, where the hierarchy generator 202 receives a plurality of particles and a plurality of constraints from the particle database 208. Each of the particles in the plurality of particles occupies an initial position in the virtual graphics scene and has an initial velocity. Each particle is also associated with a set of external forces acting on the particle and a set of initial constraints.

At step 304, the hierarchy generator 202 includes each particle within the plurality of particles in either a first set of particles or a second set of particles. The first set of particles includes child particles that correspond to parent particles included in the second set of particles. A technique for including each particle in either the first set of particles or the second set of particles is described in greater detail below in FIG. 4. According to the technique described in FIG. 4, each particle in the virtual graphics scene is assigned to either the first level or the second level of the particle hierarchy 204 based on one or more constraints associated with the particle.

At step 306, the hierarchy generator 202 selects a first particle included in the first set of particles. At step 308, the hierarchy generator 202 generates a correction weight between the first particle and each parent particle of the first particle. Each correction weight is generated according to Equation 1

$$w_{P_j P_k} = \frac{1}{\frac{d_{P_j P_k}}{\max(d_{P_j P_k})} + \varepsilon}$$  Equation 1

According to Equation 1, a correction weight denoted $w_{jk}$ is generated for a particle $P_j$ and a particle $P_k$ based on the initial distance between particles $P_j$ and $P_k$, denoted $d_{P_1 P_2}$, and based on the maximum possible distance between particles $P_j$ and $P_k$, denoted $\max(d_{jk})$. $\max(d_{jk})$ is based on a distance constraint associated with particles $P_j$ and $P_k$ and defines the maximum allowable distance between those particles. In addition, the increment $\varepsilon$ is added to the denominator of Equation 1 to ensure that the denominator of Equation 1 does not equal zero. In one embodiment, the increment $\varepsilon$ is a decimal value. Equation 1 may be applied to generate a correction weight between the first particle and each of the parent particles of the selected particle. Once the hierarchy generator 202 has generated the correction weights for the first particle, the hierarchy generator 202 normalizes each of these correction weights by dividing the correction weight by the sum of the correction weights associated with the first particle.

At step 310, the hierarchy generator 202 "collapses" initial constraints associated with the first particle. As referred to herein, "collapsing" constraints associated with the first particle includes generating new hierarchical constraints between certain neighbor particles of the first particle, as described in greater detail below in FIG. 5A and illustrated by example in FIG. 5B. As also described in FIGS. 5A and 5B, the new hierarchical constraints are generated based on initial constraints between the first particle and each of the certain neighbor particles.

At step 311, the hierarchy generator 202 determines whether additional particles in the first set of particles may be selected and processed according to steps 306, 308, and 310. If additional particles may be selected and processed, then the method 300 returns to step 306 and proceeds as described above. Otherwise, the method 300 proceeds to step 312.

At step 312, the hierarchy generator 202 generates the particle hierarchy 204. The particle hierarchy 204 has a first level and a second level. At step 314, the hierarchy generator 202 assigns the particles included in the first set of particles to the first level of the particle hierarchy 204. At step 316, the hierarchy generator assigns the particles included in the second set of particles to the second level of the particle hierarchy 204. The hierarchy generator 202 also includes the hierarchical constraints generated for each particle in the particle hierarchy 204.

Those skilled in the art will recognize that although the method 300 describes a technique for generating the particle hierarchy 204 with a first level and a second level, the method 300 may be implemented by the hierarchy generator 202 to generate the particle hierarchy 204 having any number of levels. For example, the hierarchy generator 202 could generate the particle hierarchy 204 with three levels by implementing steps 302, 304, 306, 308, and 310 of the method 300 with the plurality of particles in a first pass to generate the first and second sets of particles. The hierarchy generator 202 could then implement steps 304, 306, 308, and 310 of the method 300 with the particles included in the second set of particles to generate a third set of particles. The hierarchy generator 202 could then assign the particles included in the first, second, and third sets of particles to the first, second, and third levels of the particle hierarchy 204, respectively.

Figure 4:
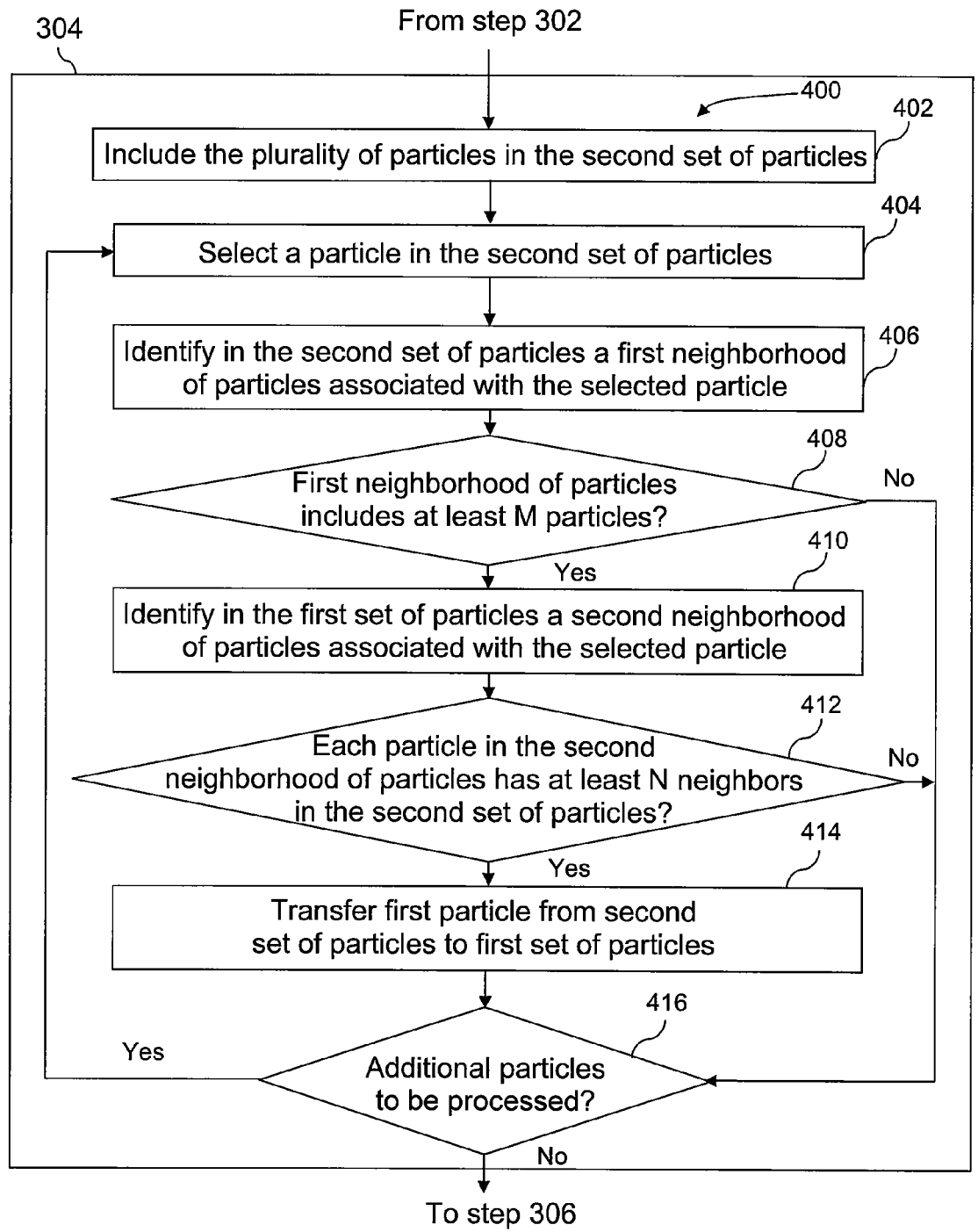
FIG. 4 is a flowchart of method steps for assigning a particle to a first set of particles or to a second set of particles, according to one embodiment of the invention.

FIG. 4 is a flowchart of method steps for including a particle in either the first set of particles or the second set of particles, according to one embodiment of the invention. Persons skilled in the art will understand that, although the method 400 is described in conjunction with the systems of FIGS. 1-2, any system configured to perform the method steps, in any order, is within the scope of the present invention. In one embodiment, the method 400 is implemented in order to perform step 304 of the method 300, as previously described in FIG. 3.

As shown, the method 400 begins at step 402, where the hierarchy generator 202 includes the plurality of particles in the second set of particles. Initially, all of the particles in the plurality of particles are included in the second set of particles. However, through implementing steps 404, 406, 408, 410, 412, and 414 of the method 400 repeatedly, as further described herein, the hierarchy generator 202 transfers a portion of the particles initially included in the second set of particles to the second set of particles.

At step 404, the hierarchy generator 202 selects a particle in the second set of particles. At step 406, the hierarchy generator 202 identifies in the second set of particles a first neighborhood of particles associated with the selected particle. As referred to herein, a "neighborhood" of particles associated with a particular particle includes any particle associated with a constraint with which the particular particle is also associated. For example, if a distance constraint $C_1$ restricts the distance between two particles $P_j$ and $P_k$ to be less than a particular value, then the neighborhood of particle $P_j$ includes the particle $P_k$ and the neighborhood of the particle $P_k$ includes the particle $P_j$. The particles $P_j$ and $P_k$ are referred to herein as "sharing" the constraint $C_1$. Additionally, any two or more particles associated with a same constraint, such as the particles $P_j$ and $P_k$ described in the above example, are referred to herein as "neighbor" particles to one another. The first neighborhood of particles therefore includes each neighbor particle of the selected particle that is included in the second set of particles, where each neighbor particle shares a constraint with the selected particle.

At step 408, the hierarchy generator 202 determines that the first neighborhood of particles includes at least M particles, where M is an integer value. In one embodiment, M is equal to 2. If the first neighborhood includes at least M particles, then the method 400 proceeds to step 410.

At step 410, the hierarchy generator 202 identifies in the first set of particles a second neighborhood of particles associated with the selected particle. Initially, when the first set of particles does not include any particles, the second neighborhood of particles does not include any particles. However, after subsequent repetitions of steps 404, 406, 408, 410, 412, and 414, as previously described, the first set of particles may include a number of particles and, thus, the first neighborhood of particles may include a portion of those particles.

At step 412, the hierarchy generator 202 determines that each particle in the second neighborhood of particles has at least N neighbors in the second set of particles, where N is an integer value. In one embodiment, N is equal to M. In a situation where the second neighborhood of particles does not include any particles, the method 400 proceeds to step 414. If each particle in the second neighborhood of particles has at least N neighbors in the second set of particles, then the method 400 also proceeds to step 414.

At step 414, the hierarchy generator 202 transfers the selected particle from the second set of particles to the first set of particles. At step 416, the hierarchy generator 202 determines that additional particles may be selected and processed according to steps 404, 406, 408, 410, 412, and 414. If additional particles are to be selected and processed, then the method 400 returns to step 404 and proceeds as described above. Otherwise, the method 400 terminates, thereby allowing the method 300 to advance from step 304 to step 306.

Figure 5A:
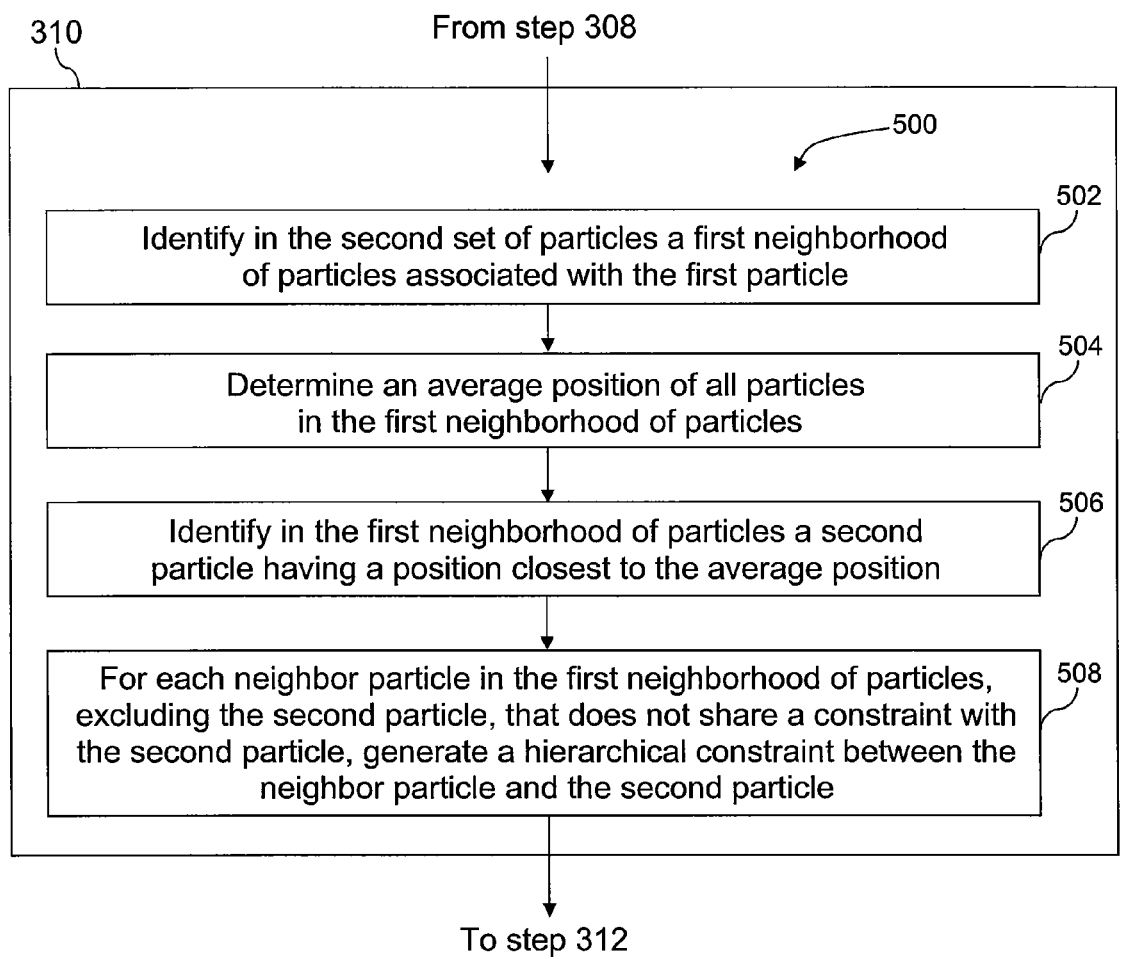
FIG. 5A is a flowchart of method steps for collapsing an initial constraint associated with a particle, according to one embodiment of the invention.

FIG. 5A is a flowchart of method steps for collapsing initial constraints associated with the first particle, according to one embodiment of the invention. Persons skilled in the art will understand that, although the method 500 is described in conjunction with the systems of FIGS. 1-2, any system configured to perform the method steps, in any order, is within the scope of the present invention. In one embodiment, the method 500 is implemented to perform step 310 of the method 300, as previously described in FIG. 3.

As shown, the method 500 begins at step 502, where the hierarchy generator 202 identifies, in the second set of particles, a first neighborhood of particles associated with the first particle. The first neighborhood of particles includes particles in the second set of particles that share a constraint with the first particle. Accordingly, each of the particles in the first neighborhood of particles is a parent particle of the first particle.

At step 504, the hierarchy generator 202 determines an average position of the particles included in the first neighborhood of particles. The hierarchy generator 202 determines the average position by averaging corresponding position coordinates of each particle in the first neighborhood of particles. For example, the hierarchy generator could average an X position coordinate of each particle in the first neighborhood to generate an average X position coordinate, and so forth.

At step 506, the hierarchy generator 202 identifies, in the first neighborhood of particles, a second particle having a position closest to the average position. The hierarchy generator 202 identifies the second particle by determining the distance from each particle in the first neighborhood of particles to the average position and then selecting the particle having the least distance to the average position.

At step 508, for each neighbor particle of the first particle, excluding the second particle, that is not a neighbor of the second particle, the hierarchy generator 202 generates a hierarchical constraint between the neighbor particle and the second particle.

The hierarchical constraint is based on one or more initial constraints between the neighbor particle and the first particle and on one or more initial constraints between the first particle and the second particle. For example, if the first particle shared a first distance constraint with the neighbor particle and also shared a second distance constraint with the second particle, then the hierarchical constraint would be a third distance constraint based on the first and second distance constraints. In this example, the hierarchical constraint could also be based on the initial distance between the neighbor particle and the second particle. Those skilled in the art will recognize that the method 500 may be implemented for any particle included in the first set of particles.

Once the hierarchy generator 202 generates a hierarchical constraint for the first particle, the method 500 terminates, thereby allowing the method 300 to advance from step 310 to step 312.

Figure 5B:
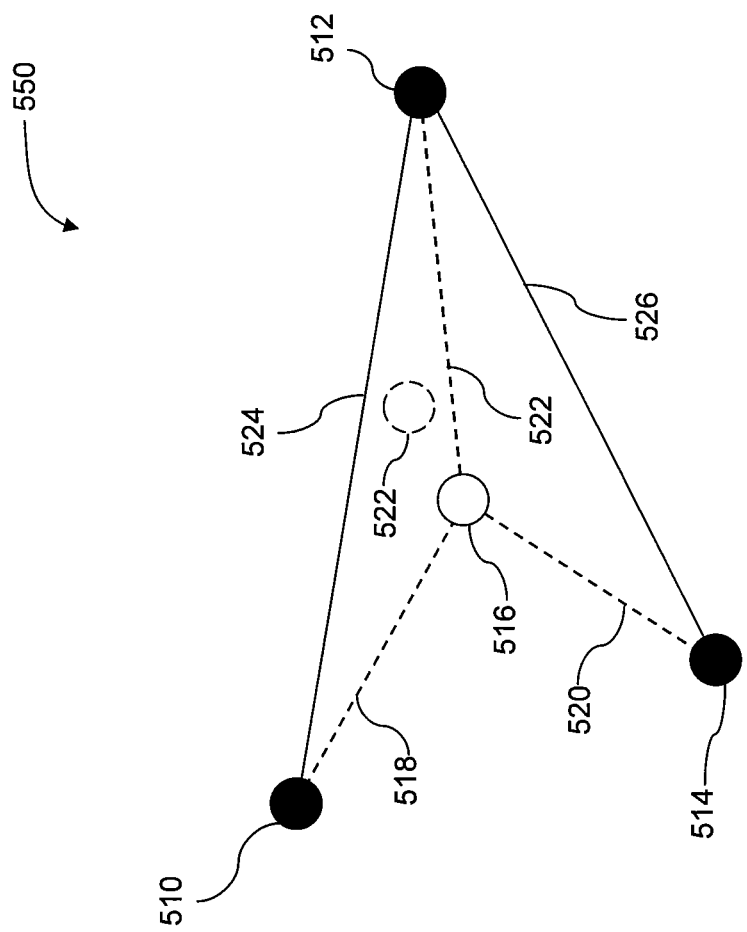
FIG. 5B is a conceptual diagram that illustrates an example of collapsing initial constraints associated with a particle, according to one embodiment of the invention.

FIG. 5B is a conceptual diagram that illustrates an example of collapsing initial constraints associated with a particle, according to one embodiment of the invention. As shown, FIG. 5B includes a particle diagram 550. The particle diagram 550 includes parent particles 510, 512, 516, child particle 516, initial constraints 518, 520, 522, hierarchical constraints 524, 526, and average position 522

Child particle 516 corresponds to the first particle described in FIG. 5. Parent particle 510 and child particle 516 are both associated with initial constraint 518, parent particle 512 and child particle 516 are both associated with initial constraint 522, and parent particle 514 and child particle 516 are both associated with initial constraint 520. Accordingly, parent particles 510, 512, and 514 are each neighbors of child particle 516 and are thus included in a neighborhood associated with child particle 516. The neighborhood associated with the child particle 516 corresponds to the first neighborhood of particles generated at step 502 of the method 500.

Position 522 represents an average of the positions of each of the parent particles 510, 512, and 514. Position 522 corresponds to the average position generated at step 504 of the method 500. Parent particle 512 occupies a position closest to the position 522, and so parent particle 512 is selected as the second particle, as described in step 506 of the method 500. Parent particle 510 and 514 do not share a constraint with parent particle 512, and so the hierarchy generator 202 generates hierarchical constraints 524 and 526 between parent particle 510 and parent particle 512, and between parent particle 514 and parent particle 512, respectively. Generating the hierarchical constraints 524 and 526 in this fashion corresponds to step 510 of the method 500.

Once the hierarchy generator 202 has generated the particle hierarchy 204, the physics simulation engine 122 may execute the physics simulation. As previously described, the physics simulation engine 122 implements the hierarchical solver 206 to execute the physics simulation.

FIG. 6 is conceptual diagram that illustrates the hierarchical solver 206 of FIG. 2 in greater detail, according to one embodiment of the invention. As shown, the hierarchical solver 206 includes a prediction engine 602, position predictions 604, a correction engine 606, corrected positions 604.

The prediction engine 602 is configured to generate the position predictions 604 based on the current position, current velocity, and set of external forces associated with each particle included in the particle database 208 at each time step in the physics simulation. The position predictions 604 includes a position prediction and a velocity prediction for each particle in the virtual graphics scene. For each particle in the virtual graphics scene, at a current time step in the physics simulation, the prediction engine 602 retrieves the set of external forces acting on the particle, the current velocity of the particle, and the current position of the particle from the particle database 208. The prediction engine 602 integrates the set of external forces acting on the particle to generate a velocity prediction for the particle. The prediction engine 602 then integrates the velocity prediction to generate a position prediction for the particle. In one embodiment, the prediction engine 602 implements the explicit Euler technique to integrate the set of external forces and to integrate the velocity prediction. In alternative embodiments, another numerical integration technique may be used to generate the position prediction. The prediction engine 602 generates a predicted position for each particle in the virtual graphics scene to generate the position predictions 604.

At the current time step, the correction engine 606 retrieves the position predictions 604, the particle hierarchy 204, and the initial constraints associated with each particle from the particle database 208. The correction engine 206 then generates zero or more collision constraints for each particle in the virtual graphics scene. The correction engine 206 generates a collision constraint for a particle when the position prediction generated for the particle is identical to the position prediction for at least one other particle. A collision constraint associated with two particles takes the form $C_{coll}(P_j, P_k) = |P_j - P_k| > 0$, and $P_j$ and $P_k$ represent the respective positions of the two particles. A collision constraint may be associated with any number of different particles having the same position prediction.

Once the correction engine 606 generates the collision constraints for each particle, the correction engine 606 enforces each of the initial constraints, hierarchical constraints, and collision constraints associated with the parent particles (i.e., the particles assigned to the second level of the particle hierarchy). The correction engine 606 enforces each constraint by modifying the position predictions corresponding to the parent particles associated with the constraint. The correction engine 606 enforces each constraint separately by implementing a non-linear Gauss-Seidel algorithm.

The non-linear Gauss-Seidel algorithm approximates a particular constraint C associated with one or more parent particles according to Equation 2:

$$C(P+\Delta P) \approx C(P) + \nabla_P {}^*C(P) + \Delta P = 0 \qquad \text{Equation 2}$$

In Equation 2, P represents a vector that includes the position predictions for each parent particle associated with the constraint C. ΔP represents a correction that may be applied to the position predictions P so that the position predictions P satisfy the constraint C. ∇P represents the derivative of C with respect to each element of P. According to the non-linear Gauss-Seidel algorithm, ΔP is restricted to be in the direction of ∇P. This restriction conserves linear and angular momentum and also prevents the constraint C from being underdetermined. ΔP can then be solved to yield Equation 4:

$$\Delta P = \lambda {}^* \nabla_P {}^* C(P) \qquad \text{Equation 3}$$

In equation 3, λ is a Lagrange multiplier that is determined using conventional techniques. Based on Equation 3, the correction ΔPj can be found for a particular particle having a position prediction Pj according to Equations 4 and 5:

$$\Delta P_j = -s {}^* w_j {}^* \nabla_P {}^* C(P) \qquad \text{Equation 4}$$

In equation 4, wj is equal to 1/mj, where mj is the mass of the particle, and the quantity s is provided by Equation 5:

$$s = \frac{C(P)}{\sum_k w_k * |\nabla_{P_k} * C(P)|^2} \qquad \text{Equation 5}$$

In Equation 5, the value k represents all k particles associated with the constraint C. The correction engine 606 may thus generate a correction ΔPk for each parent particle associated with the constraint C by implementing the non-linear Gauss-Seidel algorithm described herein. The correction engine 606 may then update the position prediction associated with the particle to reflect the correction ΔPk associated with the particle.

The correction engine 606 implements the non-linear Gauss-Seidel algorithm described above to enforce each of the constraints associated with the parent particles in the particle hierarchy 204. For each constraint and for each parent particle associated with that constraint, the correction engine 606 generates a different correction for the parent particle and then updates the position prediction corresponding to that parent particle. Accordingly, the position prediction for the parent particle may be updated multiple times depending on the number of constraints with which the parent particle is associated.

In one embodiment, the correction engine 606 enforces the constraints associated with some or all of the parent particles in the particle hierarchy 204 in multiple passes. Since the correction engine 606 enforces each constraint separately, a correction is occasionally applied to one or more position predictions causing those position predictions to no longer satisfy a constraint that was previously satisfied. In this situation, the correction engine 606 implements the non-linear Gauss-Seidel algorithm to enforce the constraint that was previously satisfied. In this fashion, the correction engine 606 implements the non-linear Gauss-Seidel algorithm to enforce any constraint that is not satisfied until all of the constraints associated with the parent particles are satisfied.

The correction engine 606 generates the corrected position predictions 608 for the parent particles in the particle hierarchy 204 by enforcing each constraint equation associated with those parent particles at each timestep. The correction engine 606 then generates a corrected position prediction for each child particle in the particle hierarchy 204 based on the corrected position predictions generated for the parent particles corresponding to those child particles and based on the correction weights, as further described herein.

For each child particle, the correction engine 204 identifies the parent particles of the child particle. The correction engine 602 then generates a corrected position prediction $P_{corr}$ for the child particle according to Equation 6:

$$P_{corr} = P_j + \sum_{k \in P(j)} w_{jk} * (P_k - Q_k) \qquad \text{Equation 6}$$

In Equation 6, P(j) is a set of indices that identifies the parent particles of the child particle. $P_j$ is the position prediction for the child particle. $w_{jk}$ is a correction weight between the child particle and a parent particle of the child particle. $P_k$ represents the position prediction for the parent particle generated by the prediction engine 602, and $Q_k$ represents the corrected position prediction for the parent particle generated by the correction engine 606. The correction engine 602 implements Equation 6 to generate corrected position predictions for each child particle in the particle hierarchy 204.

Once the correction engine 606 has generated a corrected position prediction for each particle in the particle hierarchy 204, the correction engine 606 generates a corrected velocity prediction based on the difference between the current position of the particle, the corrected position prediction generated for the particle, and the size of the time step. The correction engine 606 then accesses the particle database 208 and updates the current position of the particle to reflect the corrected position prediction, and updates the current velocity to reflect the corrected velocity prediction. The physics simulation engine 122 may then proceed to a subsequent time step in the physics simulation.

FIG. 7 sets forth a flowchart of method steps for generating a corrected position prediction for a first particle and a corrected position prediction for a second particle, according to one embodiment of the invention. Persons skilled in the art will understand that, although the method 700 is described in conjunction with the systems of FIGS. 1-2 and 6, any system configured to perform the method steps, in any order, is within the scope of the present invention.

As shown, the method 700 begins at step 702, where the hierarchical solver 206 receives the plurality of particles in the virtual graphics scene, the initial constraints associated with those particles, and the particle hierarchy 204. At the current time step, each particle occupies a current position in the virtual graphics scene and has a current velocity. Each particle is associated with a set of external forces acting on the particle and has a particular mass value.

At step 704, the prediction engine 602 within the hierarchical solver 206 generates a position prediction for each particle in the virtual graphics scene. The prediction engine 602 integrates the set of external forces acting on the particle to generate a velocity prediction for the particle. The prediction engine 602 then integrates the velocity prediction to generate a position prediction for the particle. In one embodiment, the prediction engine 602 implements the explicit Euler numerical integration technique to generate the position prediction for the particle. In an alternative embodiment, the correction engine 602 implements a different numerical integration technique. The prediction engine 602 stores the position predictions for each particle in position predictions 604.

At step 706, the correction engine 606 generates zero or more collision constraints for each particle in the virtual graphics scene. The correction engine 606 generates a collision constraint for a particle when the position prediction generated for the particle is identical to the position prediction for at least one other particle. A collision constraint associated with two particles takes the form $C_{coll}(P_j, P_k) = |P_j - P_k| > 0$, and $P_j$ and $P_k$ represent the respective positions of the two particles. A collision constraint may be associated with any number of different particles having the same position prediction.

At step 708, the correction engine 606 generates a corrected position prediction for each parent particle in the particle hierarchy 204 by enforcing one or more constraints associated with those parent particles. The constraints may include initial constraints, hierarchical constraints and/or collision constraints. The correction engine 606 enforces each constraint separately by modifying the position predictions for each parent particle associated with the constraint using the non-linear Gauss-Seidel algorithm described in FIG. 6.

At step 710, the correction engine 606 selects a child particle in the particle hierarchy 204. As previously described, the child particle is associated with at least two parent particles in the particle hierarchy 204.

At step 712, the correction engine 606 generates a corrected position prediction for the child particle based on the current position of the child particle, the current positions of the at least two parent particles, the corrected position predictions generated for the at least two parent particles, and the correction weights between the child particle and the at least two parent particles. Those skilled in the art will recognize that step 712 may be repeated for each child particle in the particle hierarchy.

At step 714, the correction engine 606 generates a corrected velocity prediction for each particle in the virtual graphics scene. The correction engine 606 generates the corrected velocity prediction based on the difference between the current position of the particle, the corrected position prediction generated for the particle, and the size of the time step.

At step 716, the correction engine 606 sets the current velocity of each particle in the virtual graphics scene to the corrected velocity prediction corresponding to the particle. At step 718, the correction engine 606 sets the current position of each particle in the virtual graphics scene to the corrected position prediction corresponding to the particle. The correction engine 606 sets the current velocity and the current position of each particle to the corrected velocity prediction and the corrected position prediction corresponding to the particle, respectively, by accessing the particle database 208.

At step 720, the hierarchical solver advances to a subsequent time step in the physics simulation.

In embodiments where the particle hierarchy 204 includes greater than two levels, the correction engine 606 may implement steps 708, 710, and 712 repeatedly to generate corrected position predictions for each level of the particle hierarchy 204.

Once the correction engine 606 updates the current velocity and current position of each particle in the virtual graphics scene, the physics simulation engine 122 transmits the current position of each particle in the virtual graphics scene to the software application 118. The software application 118 may then implement the rendering engine 120 to render an image of the virtual graphics scene for output to a display device.

Figure 7B:
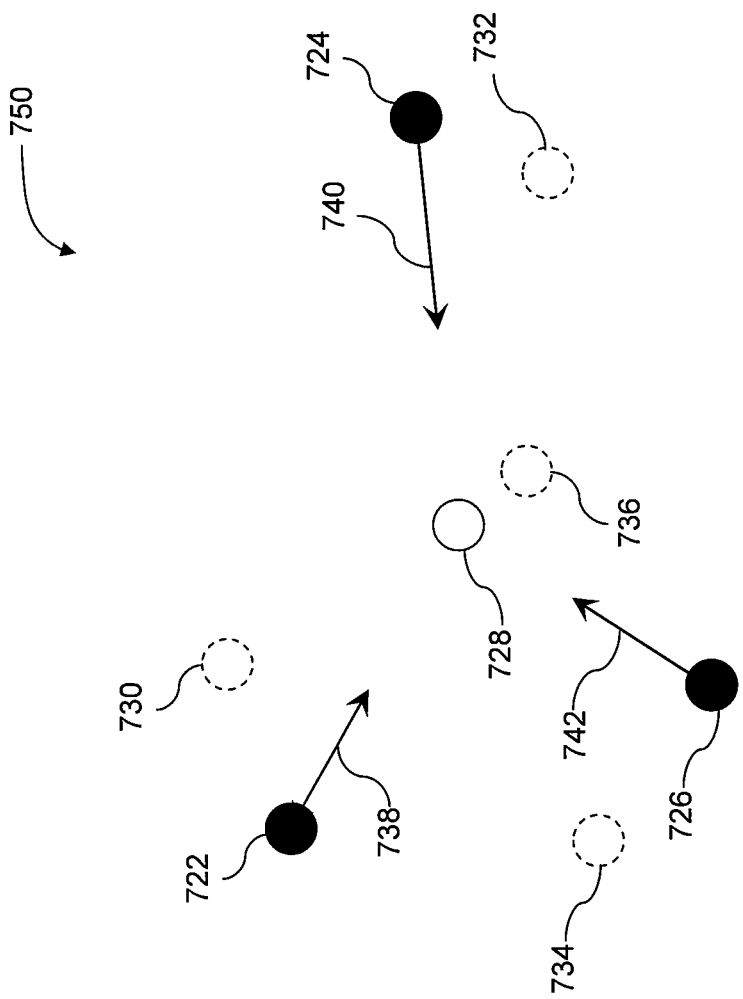
FIG. 7B is a conceptual diagram illustrating an example of how a corrected position prediction for particles in a virtual graphics scene may be generated, according to one embodiment of the invention.

FIG. 7B is a conceptual diagram illustrating an example of how a corrected position prediction for particles in a virtual graphics scene may be generated, according to one embodiment of the invention. As shown, FIG. 7B includes a particle diagram 750. The particle diagram 750 included parent particles 722, 724, 726, child particle 728, corrected position predictions 730, 732, 734, 736, and correction weights 738, 740, 742.

Each of parent particles 722, 724, and 726 is a parent particle of the child particle 728. Parent particle 722 and child particle 728 are both associated with correction weight 738, parent particle 724 and child particle 728 are both associated with correction weight 740, and parent particle 726 and child particle 728 are both associated with correction weight 742.

The location of each of the parent particles 722, 724, 726, and child particle 728 corresponds to the position prediction generated for that particle, as described in conjunction with step 704 of the method 700. Corrected position predictions 730, 732, and 734 correspond to the corrected position predictions generated for parent particles 722, 724, and 726, respectively, as described in conjunction with 708 of the method 700.

The corrected position prediction 736 is generated for the child particle 728 based on the position predictions generated for the parent particles 722, 724, and 726, the corrected position predictions 730, 732, and 734 corresponding to those particles, and the corrections weights 738, 740, and 742. Generating the corrected position prediction 736 in this fashion is described in conjunction with step 712 of the method 700.

In addition to generating corrected position predictions for each particle in the virtual graphics scene via the prediction engine 602 and the correction engine 606, the hierarchical solver 206 may also update the particle hierarchy 204 dynamically at a particular time step in the physics simulation under certain circumstances. When the distance between two particles that share a distance constraint exceeds a threshold value, the hierarchical solver 206 may update the particle hierarchy 204.

Figure 8:
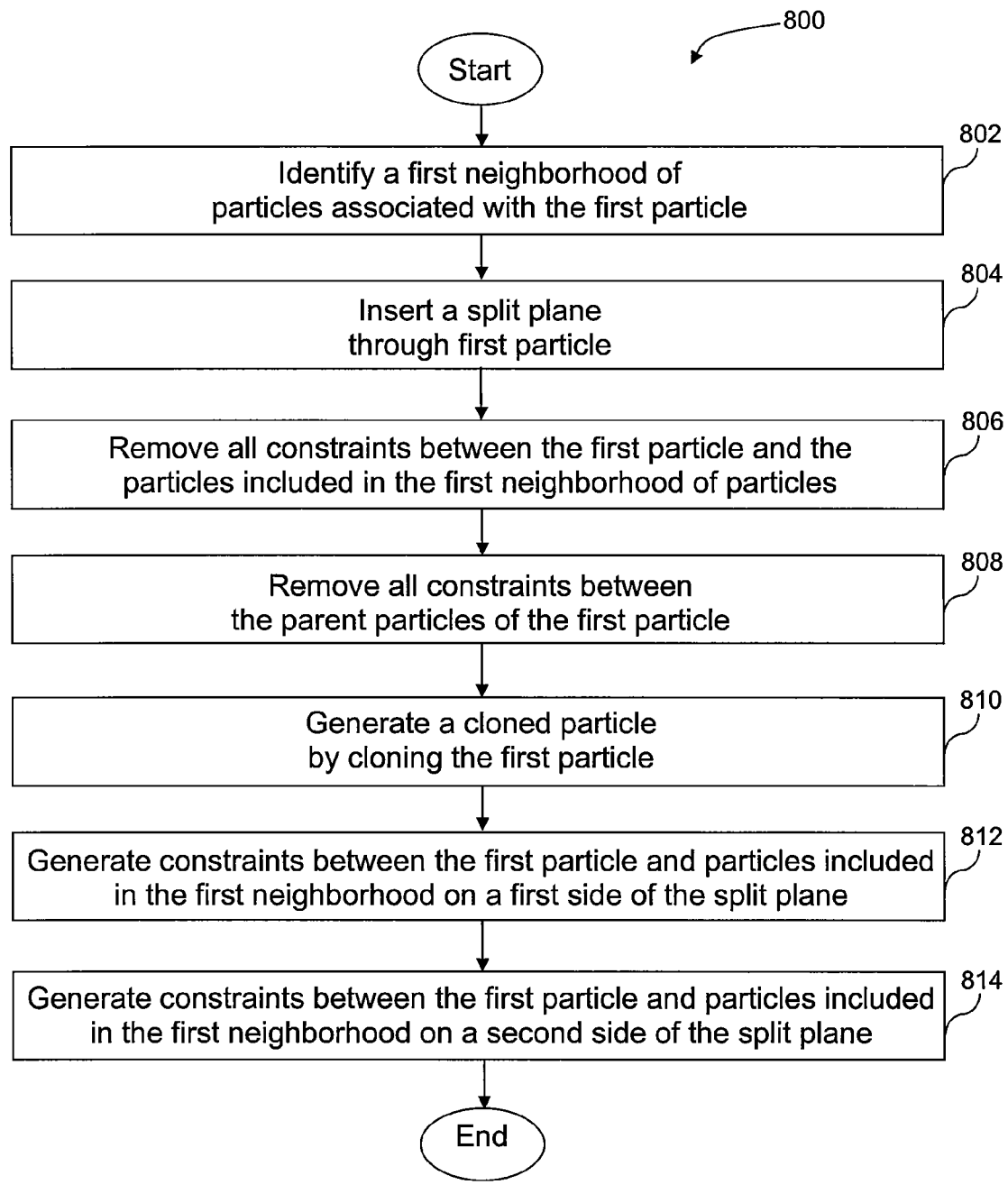
FIG. 8 is a flowchart of method steps for updating the particle hierarchy of FIG. 2, according to one embodiment of the invention.

FIG. 8 is a flowchart of method steps for updating the particle hierarchy 204, according to one embodiment of the invention. Persons skilled in the art will understand that, although the method 800 is described in conjunction with the systems of FIGS. 1-2 and 6, any system configured to perform the method steps, in any order, is within the scope of the present invention. The hierarchical solver 206 implements the method 800 when the distance between a first particle and second particle exceeds a threshold value, and the first particle and the second particle share a distance constraint.

As shown, the method 800 begins at step 802, where the hierarchical solver identifies a first neighborhood of particles associated with the first particle. This first neighborhood of particles includes any particles that share a constraint with the first particle.

At step 804, the hierarchical solver inserts a "split plane" through the first particle. The split plane separates the particles included in the first neighborhood into two groups that reside on opposing sides of the split plane. The split plane is inserted such that a line connecting the first particle to the second particle is perpendicular to the split plane.

At step 806, the hierarchical solver 206 removes all constraints between the first particle and the particles included in the first neighborhood of particles. At step 808, the hierarchical solver 206 removes all constraints between the parent particles of the first particle. The constraints removed in steps 806 and 808 may include initial constraints, hierarchical constraints and/or collision constraints.

At step 810, the hierarchy generator 206 generates a cloned particle by cloning the first particle. The cloned particle occupies a position on a first side of the split plane. In one embodiment, the cloned particle has the same mass value as the first particle.

At step 812, the hierarchical solver 206 generates one or more hierarchical constraints between the cloned particle and any particles included in the first neighborhood of particles residing on the first side of the split plane. The hierarchical constraints generated for the cloned particle are distance constraints that restrict the position of the cloned particle relative to the particles included in the first neighborhood of particles residing on the first side of the split plane.

At step 814, the hierarchical solver 206 generates one or more hierarchical constraints between the first particle and any particles included in the first neighborhood of particles residing on the second side of the split plane. The hierarchical constraints generated for the first particle are distance constraints that restrict the position of the first particle relative to the particles included in the first neighborhood of particles residing on the second side of the split plane.

By implementing the method 800, the hierarchical solver 206 updates the particle hierarchy 204 in situations where particles that share a distance constraint have a distance from one another that exceeds a threshold value. This feature of the hierarchical solver 206 allows the physics simulation 122 to simulate virtual objects that may break apart or tear. For example, if the particles in the virtual graphics scene represent a piece of cloth, and each particle in the piece of cloth shares a distance constraint with an adjacent particle, then the cloth may be torn by removing the distance constraints shared between particles on either side of the tear and inserting cloned particles along the edges of the tear, as described.

In sum, the physics simulation engine executes a physics simulation to simulate the motion of virtual objects in a virtual graphics scene by simulating the motion of particles that compose the virtual objects. At each timestep in the physics simulation, the physics simulation engine generates a position prediction for each particle in the virtual graphics scene. The physics simulation engine then generates a corrected position prediction for the particle by enforcing constraints associated with the particle using a particle hierarchy. Finally, the physics simulation engine updates the position of the particle in the virtual graphics scene to reflect the corrected position prediction.

The particle hierarchy includes at least a first level and a second level. Prior to the physics simulation engine executing the physics simulation, a hierarchy generator generates the particle hierarchy by assigning each particle in the virtual graphics scene to either the first level or the second level of the particle hierarchy. The hierarchy generator generates correction weights between the particles in the first level of the particle hierarchy and the particles in the second level of the particle hierarchy. The hierarchy generator also generates hierarchical constraints for the particles in the second level of the particle hierarchy by collapsing initial constraints associated with particles in the first level of the particle hierarchy.

When the physics simulation engine executes the physics simulation, a hierarchical solver generates position predictions for each particle in the virtual graphics scene. The hierarchical solver then generates corrected position predictions for the particles in the second level of the hierarchy by implementing a non-linear Gauss-Seidel algorithm. The hierarchical solver also generates corrected position predictions for the particles in the first level of the particle hierarchy based on the corrected position predictions generated for the particles in the first level of the particle hierarchy.

Advantageously, constraint equations are solved for fewer particles at each timestep in the physics simulation since the second level of the particle hierarchy only includes a subset of the particles in the virtual graphics scene. The corrected position predictions generated for these particles can then be used to generate corrected position predictions for the particles in the first level of the particle hierarchy. By implementing the physics simulation engine, more detailed physics simulations are possible, when compared to prior art techniques.

Since fewer constraint equations need to be solved at each timestep, a corrected position prediction can be generated for each particle in the virtual graphics scene and can thus be generated for all of the particles that represent a particular virtual object. The physics simulation engine is thereby capable of generating a physically accurate simulation of the virtual object, allowing physically realistic images to be generated based on that physics simulation.

While the forgoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention.

Therefore, the scope of the present invention is determined by the claims that follow.

I claim:

1. A computer-implemented method for executing a physics simulation of a plurality of particles in a virtual graphics scene, the method comprising:
   generating a position prediction for a first particle assigned to a first level of a particle hierarchy that includes the first level and a second level, wherein each particle in the plurality of particles is assigned to either the first level or the second level of the particle hierarchy, and wherein the first level of the particle hierarchy includes particles having a fine level of detail and the second level of the particle hierarchy includes particles having a coarse level of detail;
   generating a position prediction for a second particle assigned to the second level of the particle hierarchy;
   generating a corrected position prediction for the first particle based on the position prediction for the first particle and one or more constraint equations associated with the first particle;
   generating a corrected position prediction for the second particle based on the corrected position prediction for the first particle and a correction weight based on a distance between the first particle and the second particle and a constraint associated with the distance;
   generating an image for storage in a memory and/or display on a display device based on the corrected position prediction for the first particle and the corrected position prediction for the second particle.

2. The method of claim 1, wherein each particle assigned to the first level of the particle hierarchy is associated with at least one correction weight assigned to a particle assigned to the second level of the particle hierarchy.

3. The method of claim 1, wherein the step of generating the position prediction for the first particle is based on a current position of the first particle, a current velocity of the first particle, one or more external forces acting on the first particle, and a size of a time step associated with the physics simulation.

4. The method of claim 3, wherein the step of generating the corrected position prediction for the second particle is further based on the current position of the first particle and a correction weight associated with the first particle and the second particle, wherein the correction weight reflects the degree to which the current position of the first particle and the corrected position prediction for the first particle affect the corrected position prediction for the second particle.

5. The method of claim 3, further comprising the step of generating a corrected velocity prediction for the first particle based on the current position of the first particle, the corrected position prediction for the first particle, and the size of the time step.

6. The method of claim 3, further comprising the steps of:
   updating the current position of the first particle to reflect the corrected position prediction for the first particle;
   updating the current position of the second particle to reflect the corrected position prediction for the second particle.

7. The method of claim 1, wherein the step of generating the position prediction for the first particle comprises executing an explicit Euler numerical integration algorithm.

8. The method of claim 1, wherein the step of generating the corrected position prediction for the first particle comprises executing a non-linear Gauss-Seidel algorithm.

9. The computer-implemented method of claim 1, wherein the correction weight is a reciprocal of a sum of a non-zero increment and a ratio between a distance between the first particle and the second particle and a maximum allowable distance between the first particle and the second particle.

10. The computer-implemented method of claim 1, wherein generating the corrected position prediction for the second particle comprises generating the corrected position prediction for the second particle based on a difference between the position prediction for the second particle and the corrected position prediction for the first particle.

11. A non-transitory computer-readable medium including program instructions that, when executed by a processor, implements a physics simulation of a plurality of particles in a virtual graphics scene by performing the steps of:
   generating a position prediction for a first particle assigned to a first level of a particle hierarchy that includes the first level and a second level, wherein each particle in the plurality of particles is assigned to either the first level or the second level of the particle hierarchy, and wherein the first level of the particle hierarchy includes particles having a fine level of detail and the second level of the particle hierarchy includes particles having a coarse level of detail;
   generating a position prediction for a second particle assigned to the second level of the particle hierarchy;
   generating a corrected position prediction for the first particle based on the position prediction for the first particle and one or more constraint equations associated with the first particle;
   generating a corrected position prediction for the second particle based on the corrected position prediction for the first particle and a correction weight based on a distance between the first particle and the second particle and a constraint associated with the distance;
   generating an image for storage in a memory and/or display on a display device based on the corrected position prediction for the first particle and the corrected position prediction for the second particle.

12. The non-transitory computer-readable medium of claim 11, wherein each particle assigned to the first level of the particle hierarchy is associated with at least one correction weight assigned to a particle assigned to the second level of the particle hierarchy.

13. The non-transitory computer-readable medium of claim 11, wherein the step of generating the position prediction for the first particle is based on a current position of the first particle, a current velocity of the first particle, one or more external forces acting on the first particle, and a size of a time step associated with the physics simulation.

14. The non-transitory computer-readable medium of claim 13, wherein the step of generating the corrected position prediction for the second particle is further based on the current position of the first particle and a correction weight associated with the first particle and the second particle, wherein the correction weight reflects the degree to which the current position of the first particle and the corrected position prediction for the first particle affect the corrected position prediction for the second particle.

15. The non-transitory computer-readable medium of claim 13, further comprising the step of generating a corrected velocity prediction for the first particle based on the current position of the first particle, the corrected position prediction for the first particle, and the size of the time step.

16. The non-transitory computer-readable medium of claim 13, further comprising the steps of:
updating the current position of the first particle to reflect the corrected position prediction for the first particle;
updating the current position of the second particle to reflect the corrected position prediction for the second particle.

17. The non-transitory computer-readable medium of claim 11, wherein the step of generating the position prediction for the first particle comprises executing an explicit Euler numerical integration algorithm.

18. The non-transitory computer-readable medium of claim 11, wherein the step of generating the corrected position prediction for the first particle comprises executing a non-linear Gauss-Seidel algorithm.

19. A system for executing a physics simulation of a plurality of particles in a virtual graphics scene, comprising:
one or more processors;
one or more input/output devices; and
a memory that includes:
a physics simulation engine configured to:
generate a position prediction for a first particle assigned to a first level of a particle hierarchy by executing an explicit Euler numerical integration algorithm, wherein the particle hierarchy includes the first level and a second level, each particle in the plurality of particles is assigned to either the first level or the second level of the particle hierarchy, and wherein each particle assigned to the first level of the particle hierarchy is associated with at least one correction weight that is also associated with a particle assigned to the second level of the particle hierarchy, and wherein the first level of the particle hierarchy includes particles having a fine level of detail and the second level of the particle hierarchy includes particles having a coarse level of detail,
generate a position prediction for a second particle assigned to the second level of the particle hierarchy by executing the explicit Euler numerical integration algorithm,
generate a corrected position prediction for the first particle by executing a non-linear Gauss-Seidel algorithm based on the position prediction for the first particle and one or more constraint equations associated with the first particle,
generate a corrected position prediction for the second particle based on the corrected position prediction for the first particle and a correction weight based on a distance between the first particle and the second particle and a constraint associated with the distance,
update the current position of the first particle to reflect the corrected position prediction for the first particle, and
update the current position of the second particle to reflect the corrected position prediction for the second particle,
a rendering engine configured to generate an image for storage in the memory and/or display on a display device based on the corrected position prediction for the first particle and the corrected position prediction for the second particle, and
a software application configured to coordinate the operation of the physics simulation engine and the rendering engine.

20. The system of claim 19, wherein the step of generating the position prediction for the first particle is based on a current position of the first particle, a current velocity of the first particle, one or more external forces acting on the first particle, and a size of a time step associated with the physics simulation.

21. The system of claim 20, wherein the step of generating the corrected position prediction for the second particle is further based on the current position of the first particle and a correction weight associated with the first particle and the second particle, wherein the correction weight reflects the degree to which the current position of the first particle and the corrected position prediction for the first particle affect the corrected position prediction for the second particle.

22. The system of claim 20, further comprising the step of generating a corrected velocity prediction for the first particle based on the current position of the first particle, the corrected position prediction for the first particle, and the size of the time step.

* * * * *